United States Patent [19]

Higashisaka

[11] Patent Number: 5,708,381

[45] Date of Patent: Jan. 13, 1998

[54] VARIABLE DELAY CIRCUIT

[75] Inventor: Norio Higashisaka, Itami, Japan

[73] Assignee: Mitsubishi Denki Kabushiki Kaisha, Tokyo, Japan

[21] Appl. No.: 551,419

[22] Filed: Nov. 1, 1995

[30] Foreign Application Priority Data

Nov. 7, 1994 [JP] Japan .................................. 6-272353

[51] Int. Cl.⁶ .............................. H03L 7/099; H03K 5/13
[52] U.S. Cl. ..................... 327/276; 327/291; 327/299;
327/142; 331/57; 331/172
[58] Field of Search ........................... 327/263, 276,
327/277, 291, 299, 164, 165, 262, 264,
278; 331/57, 172, 173

[56] References Cited

U.S. PATENT DOCUMENTS

| | | | |
|---|---|---|---|
| 4,686,489 | 8/1987 | Caspell | 331/57 |
| 5,036,221 | 7/1991 | Brucculeri et al. | 327/142 |
| 5,175,453 | 12/1992 | Chang et al. | 307/603 |
| 5,315,166 | 5/1994 | Arimoto | 331/57 |
| 5,315,271 | 5/1994 | Pascual et al. | 331/57 |
| 5,355,027 | 10/1994 | Shimada et al. | 307/247.1 |

FOREIGN PATENT DOCUMENTS

| | | |
|---|---|---|
| 0600815 | 6/1994 | European Pat. Off. . |
| 4327116 | 3/1994 | Germany . |
| 61-33013 | 2/1986 | Japan ................................. 331/57 |
| 62-12880 | 1/1987 | Japan . |
| 1161912 | 6/1989 | Japan . |
| 327638 | 2/1991 | Japan . |
| 335613 | 2/1991 | Japan . |
| 5191224 | 7/1993 | Japan . |
| 2190774 | 11/1987 | United Kingdom . |

OTHER PUBLICATIONS

Excerpt from Brooktree catalogue, 1991, pp. 3-2-3-5.

*Primary Examiner*—Timothy P. Callahan
*Assistant Examiner*—Eunja Shin
*Attorney, Agent, or Firm*—Leydig, Voit & Mayer

[57] ABSTRACT

In a variable delay circuit including a high-speed clock generator receiving a trigger signal and outputting a pulse signal after a desired time interval upon rising of the trigger signal and a coarse delay signal generator, the high-speed clock generator includes a rising edge detector receiving the trigger signal, detecting a rising edge of the trigger signal, and outputting an edge detecting pulse having a time interval, and an asynchronous reset oscillator receiving the edge detecting pulse, being reset upon rising of the edge detecting pulse, and generating a high-speed clock upon falling of the edge detecting pulse. The high-speed clock generator of the variable delay circuit is realized without using analog circuits. Further, since the high-speed clock generator includes no PLL, it is not necessary to provide analog circuits, such as charge pump and VCO, in a digital LSI and, therefore, special considerations for the analog circuits are eliminated.

11 Claims, 15 Drawing Sheets

5,708,381

VARIABLE DELAY CIRCUIT

FIELD OF THE INVENTION

The present invention relates to a variable delay circuit and, more particularly, to a high-speed clock generator and a coarse delay signal generator which are constituents of a variable delay circuit realized in a digital logic circuit.

BACKGROUND OF THE INVENTION

Variable delay circuits are widely used for measuring apparatus and testers. A typical variable delay circuit has a resolution of 1~100 ps and a variable delay time interval of 10~100 ns.

FIG. 19 is a block diagram illustrating a variable delay circuit which is realized using an analog circuit technique. This variable delay circuit comprises a linear ramp generator 101 generating a ramp waveform 101a in response to external trigger signals TRIG and TRIG*, a digital-to-analog converter (DAC) 102 outputting a reference signal 102a, a comparator 103 comparing the ramp waveform 101a with the reference signal 102a and outputting timing signals OUT103a and OUT*103b, a latch 104 setting data $D_0$ to $D_7$ in the DA converter 102, an input buffer 106 to which the external trigger signals TRIG and TRIG* are input, and a D flip-flop 105 maintaining a signal CE* using the input buffer 106 as a trigger, outputting a signal to the linear ramp generator 101, and being reset by the output signal OUT103a of the comparator 103.

A description is given of the operation.

The D flip-flop 105 takes the signal CE* from the outside in response to the trigger signals TRIG and TRIG*, and the linear ramp generator 101 generates the ramp waveform 101a using an output signal from the D flip-flop 105 as a trigger. On the other hand, the DA converter 102 generates an analog voltage according to the data $D_0$ to $D_7$ which are set by the latch 104, and the comparator 103 compares the analog voltage with the ramp waveform 101a from the linear ramp generator 101 using the analog voltage as a threshold voltage. In the variable delay circuit the time interval from the input of the trigger signals TRIG and TRIG* to the inversion of the comparator 103 is varied in response to the voltage output from the DA converter 102.

In this variable delay circuit, since the analog circuits, i.e., the comparator 103, the DA converter 102, and the linear ramp generator 101, are employed, it is very difficult to realize this circuit in a digital LSI. However, with the rapid increase in integration density of digital LSIs in recent years, demand for variable delay circuits integrated on digital LSIs has been increased with a view to miniaturizing system. In order to meet the demand, it is necessary to constitute a variable delay circuit using a digital logic circuit.

There are two digital variable delay circuits according to the prior art which are proposed to meet this demand.

FIG. 20 shows a first digital variable delay circuit according to the prior art. In this circuit, two hundred and fifty five unit gates 110, each having a delay time of 100 ps, are cascade-connected to obtain a variable delay circuit having a delay range of 25.5 ns. The delay time is varied by selecting taps of the unit gates 110 using selectors 111. Since the selectors 111 are 4:1 selectors, the selectors 111 are connected like a pyramid in four stages to select two hundred and fifty six taps.

However, the first digital variable delay circuit has the following drawbacks. That is, at the tap which corresponds to a joint between the selectors 111, there is a possibility that the linearity of the delay time variation of the variable delay circuit is degraded due to the difference in the data transmission delay times between the selectors 111. That is, in the delay circuit shown in FIG. 20, since the selectors 111 in the first to third stages are all changed upon a change from the 128th tap to the 129th tap, the risk of the degradation of the linearity is high. Therefore, it is difficult for the prior art delay circuit to have a wide range of the delay time although a high resolution is achieved. When the variable range of the delay time is 1.5 ns, only fifteen unit gates are required, so that only two stages are enough for the selector structure. In this case, since the selectors in only one stage are changed at worst, the influence on linearity of the delay time variation is reduced. However, when the variable range of the delay time is wide, the influence on the linearity of the delay time variation is considerable.

In order to realize both a high resolution and a wide delay time variable range, there is a method in which a high-speed clock is divided to produce a coarse delay having a wide variable range but a low resolution and, thereafter, a highly-precise delay is produced using a gate delay circuit as described above. Since the gate delay circuit used in this method may have a narrow variable delay time range, the above-described problems are avoided.

FIG. 21 shows a digital variable delay circuit employed for the above-described method, according to the prior art. In this variable delay circuit, a coarse delay generating section 120 comprises a PLL (Phase-Locked Loop) 121 and a counter 122, and a highly-precise delay generating section 123 comprises a gate delay circuit 124. A high-speed clock CL is not applied from the outside of the LSI but produced in the LSI using the PLL 121. In this structure, since it is not necessary to exchange the high-speed clock CL between the LSI and an external device, mounting of the digital delay circuit on the LSI is facilitated.

FIG. 22 is a block diagram illustrating the counter 122 used as a coarse delay signal denerator. The counter 122 comprises a 64 bit SRL (Shift Register Latch) 125 that operates in response to a high-speed clock 12a generated in the high-speed clock generator, and a 64:1 selector 126 that selects one bit from the output bits of the 64 bit SRL 125 in response to 6 bit select data.

However, the high-speed clock generator 120 shown in FIG. 21 has the following drawback. That is, since the high-speed clock is generated using the PLL, although the frequency of the clock is easily changed, analog elements, such as a charge pump and a VCO (Voltage-Controlled Oscillator), are included in the circuit. Therefore, special consideration, for example, a countermeasure, to noise, must be given when the circuit is integrated on a digital LSI.

On the other hand, the coarse delay signal denerator 122 shown in FIG. 22 has the following drawbacks. That is, since the number of delay output lines of the bits output from the SRL 125 is as many as 64, it is difficult to control skewing by making the wiring lengths of these bits uniform. In addition, since the selector 125 is as large as 64:1, the transmission time intervals between the respective bits are easily varied, resulting in a reduction in the precision of the coarse delay signal 122a.

SUMMARY OF THE INVENTION

It is an object of the present invention to provide a variable delay circuit comprising a digital circuit.

It is another object of the present invention to provide a high-speed clock generator for the variable delay circuit, which is easily integrated on a digital LSI.

It is still another object of the present invention to provide a coarse delay signal generator for the variable delay circuit, which needs only a few delay output lines and produces a highly precise coarse delay signal.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, in a variable delay circuit comprising a high-speed clock generator receiving a trigger signal and outputting a pulse signal after a desired time interval from rising of the trigger signal, and a coarse delay signal generator; the high-speed clock generator comprises a rising edge detector receiving the trigger signal, detecting a rising edge of the trigger signal, and outputting an edge detecting pulse having a time interval; and an asynchronous reset oscillator receiving the edge detecting pulse, being reset at rising of the edge detecting pulse, and starting to generate a high-speed clock at falling of the edge detecting pulse. Therefore, the high-speed clock generator for the variable delay circuit is realized without using analog circuits. Further, since the high-speed clock generator includes no PLL, it is not necessary to provide analog circuits, such as charge pump and VCO, on a digital LSI and, therefore, special considerations for the analog circuits are dispensed with.

According to a second aspect of the present invention, in the above-described variable delay circuit, the asynchronous reset oscillator comprises an inverter chain comprising an even number of inverters connected in series, and having an input terminal; and a two-input NOR circuit having a first input terminal to which an output from the inverter chain is applied, a second input terminal to which the edge detecting pulse from the rising edge detector is applied, and an output terminal connected to the input terminal of the inverter chain, and outputting a high-speed clock signal. Since the asynchronous reset oscillator is realized by only digital circuits, an analog oscillator, such as VCO, is not necessary, so that special considerations for the analog circuit is dispensed with.

According to a third aspect of the present invention, in the above-described variable delay circuit, the asynchronous reset oscillator comprises an inverter chain comprising a plurality of inverters and a plurality of first two-input NOR circuits which are connected in series and in an even number, each first two-input NOR circuit having a first input terminal receiving an output from each inverter and a second input terminal receiving the edge detecting pulse from the rising edge detector; a second two-input NOR circuit having a first input terminal to which an output from the inverter chain is applied, a second input terminal to which the edge detecting pulse from the rising edge detector is applied, and an output terminal connected to the input terminal of the inverter chain, and outputting a high-speed clock signal; and the inverter chain and the second two-input NOR circuit constituting a ring oscillator. Therefore, when the oscillation frequency of the asynchronous reset oscillator is the same, the time interval required for resetting of the oscillator is reduced in this asynchronous reset oscillator, whereby the pulse width of the edge detecting pulse is reduced and the oscillation of the high-speed clock is made fast, resulting in a high-speed operation of the variable delay circuit.

According to a fourth aspect of the present invention, in the above-described variable delay circuit, the inverter chain included in the asynchronous reset oscillator comprises a plurality of inverters and a plurality of first two-input NOR circuits which are alternatingly connected in series. Therefore, the asynchronous reset oscillator produces a highly-stable high-speed clock.

According to a fifth aspect of the present invention, in the above-described variable delay circuit, the asynchronous reset oscillator comprises a delay path selecting means comprising a plurality of first inverter chains, each having an input terminal and comprising a plurality of first inverters connected in series, and a selector selecting one of the first inverter chains and having an output terminal; a second inverter chain comprising a plurality of second inverters connected in series, and having an input terminal connected to the output terminal of the selector; and a two-input NOR circuit having a first input terminal to which an output from the second inverter chain is applied, a second input terminal to which the edge detecting pulse from the rising edge detector is applied, and an output terminal connected to the input terminals of the first inverter chains, and outputting a high-speed clock signal. Therefore, the delay time of the asynchronous reset oscillator is controlled, and the oscillation frequency of the high-speed clock is varied.

According to a sixth aspect of the present invention, in the above-described variable delay circuit, the asynchronous reset oscillator comprises at least one delay path selecting means comprising a plurality of first inverter chains, each chain having an input terminal and comprising a plurality of first inverters connected in series, and a selector selecting one of the first inverter chains and having an output terminal; a second inverter chain comprising a plurality of second inverters and a plurality of first two-input NOR circuits which are connected in series and in an even number, and having an input terminal connected to the output terminal of the selector, wherein each first two-input NOR circuit has a first input terminal receiving an output from each inverter and a second input terminal receiving the edge detecting pulse from the rising edge detector; a second two-input NOR circuit having a first input terminal to which an output from the second inverter chain is applied, a second input terminal to which the edge detecting pulse from the rising edge detector is applied, and an output terminal connected to the input terminal of the delay path selecting means, and outputting a high-speed clock signal; and the delay path selecting means, the second inverter chain, and the second two-input NOR circuit constituting a ring oscillator. Therefore, in the above-described variable delay circuit in which the oscillation frequency of the high-speed clock is variable, the oscillation of the high-speed clock is made fast, resulting in a high-speed operation of the variable delay circuit.

According to a seventh aspect of the present invention, in the above-described variable delay circuit, the delay path selecting means, the first two-input NOR circuits, and the second inverters included in the asynchronous reset oscillator are alternatingly connected in series. Therefore, the asynchronous reset oscillator produces a highly-stable high-speed clock.

According to an eighth aspect of the present invention, in the above-described variable delay circuit, the high-speed clock generator further includes a reset pulse generator receiving the edge detecting pulse output from the rising edge detector and the high-speed clock signal output from the asynchronous reset oscillator and outputting a reset signal for resetting the coarse delay signal generator. Therefore, control of the subsequent coarse delay signal generator is facilitated.

According to a ninth aspect of the present invention, in the above-described variable delay circuit, the coarse delay signal generator comprises N pieces of $1/2^j$ ($1 \leq j \leq N$) frequency dividers having input terminals to which the high-speed clock signal generated in the high-speed clock generator is applied and output terminals from which N pieces of $1/2^j$ frequency-divided high-speed clock signals are output; N bits of coincidence detectors receiving the N pieces of $1/2^j$ frequency-divided high-speed clock signals and N bits of delay time selecting data, and detecting coincidence between the signals and the data; an N-input NOR circuit receiving outputs from the N bits of coincidence detectors; a flip-flop having a data input to which an output from the N-input NOR circuit is applied and a clock input to which the high-speed clock signal is applied; means for delaying a data output signal from the flip-flop for a prescribed time interval; and a resettable latch having a data input terminal to which an output signal from the delay means is applied, a clock input terminal to which an inverted data signal from the flip-flop is applied, and a reset input terminal to which the reset pulse that is output from the reset pulse generator in response to a next trigger signal is applied, and outputting an inverted signal as a coarse delay output. Therefore, as a coarse delay output having a waveform that maintains the output until a reset signal in response to a next trigger signal is input is obtained.

According to a tenth aspect of the present invention, in the above-described variable delay circuit, the reset pulse generator comprises a two-input OR circuit having two input terminals to which the edge detecting pulse and the high-speed clock signal from the asynchronous reset oscillator are applied, respectively; means for delaying the edge detecting pulse for a prescribed time interval; a latch circuit having a data input to which an output from the delay means is applied and an enable input to which an output from the two-input OR circuit is applied; and a flip-flop having a data input to which an output from the latch circuit is applied and a clock input to which the high-speed clock signal from the asynchronous reset oscillator is applied. Therefore, the reset pulse generator for resetting the subsequent coarse delay signal generator is included in the high-speed clock generator, whereby control of the variable delay circuit is facilitated.

DETAILED DESCRIPTION OF THE PREFERRED EMBODIMENTS

[Embodiment 1]

Figure 1:
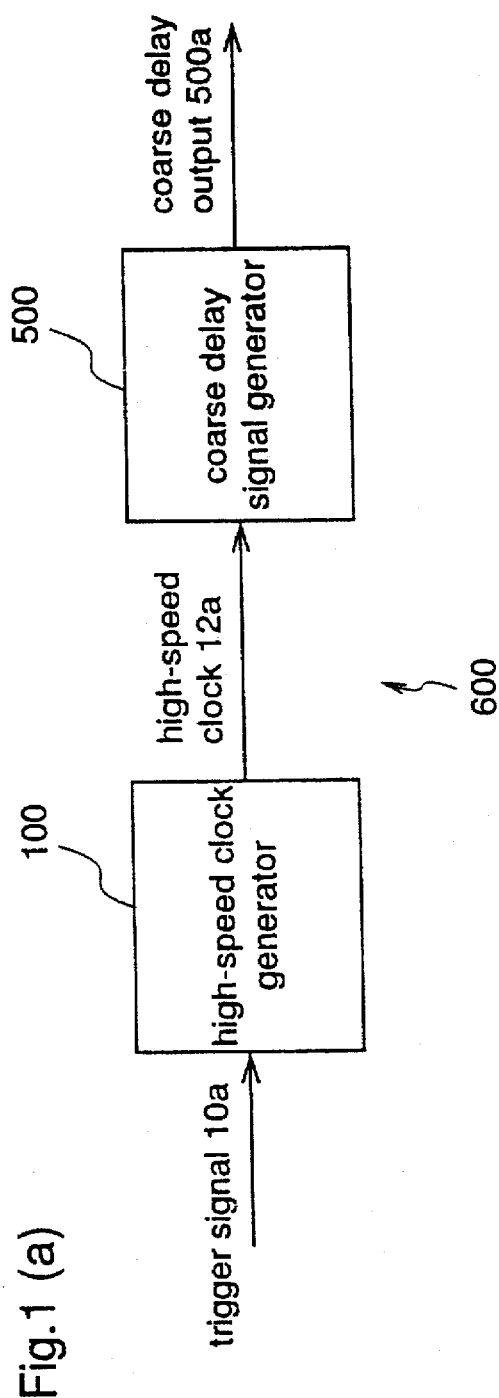
FIGS. 1(a) and 1(b) are block diagrams illustrating a variable delay circuit and a high-speed clock generator, respectively, in accordance with a first embodiment of the present invention.
Figure 1:
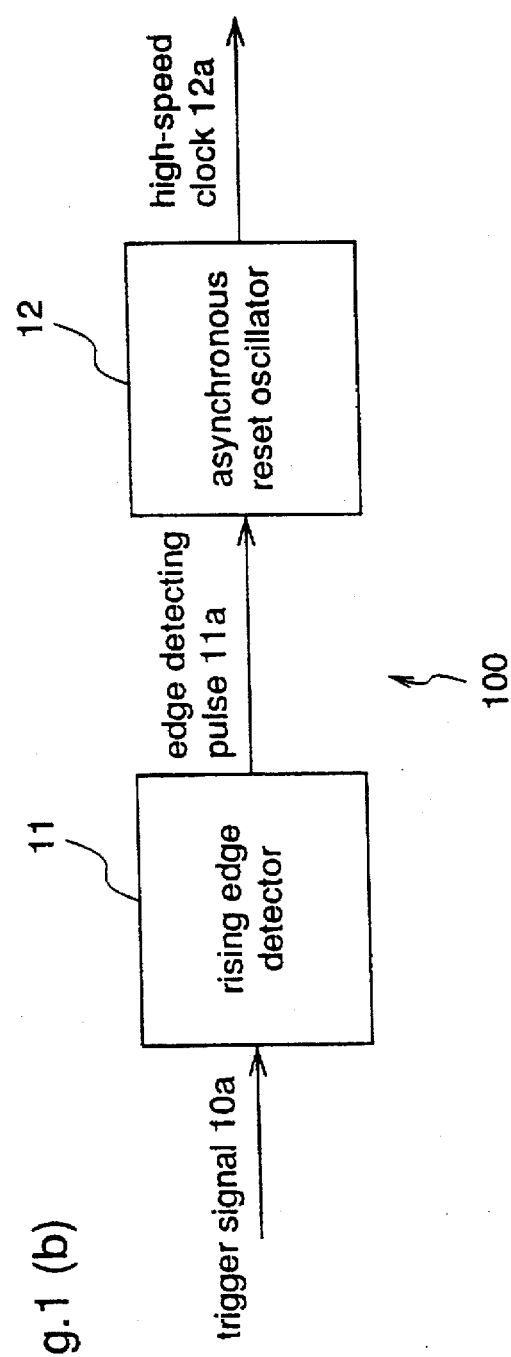

FIG. 1(a) is a block diagram illustrating a variable delay circuit 600 in accordance with a first embodiment of the present invention. The variable delay circuit 600 comprises a high-speed clock generator 100 receiving a trigger signal 10a and producing a high-speed clock 12a in response to the trigger signal 10a, and a coarse delay signal generator 500 receiving the high-speed clock signal 12a, counting the clock signal 12a, and producing a coarse delay signal.

FIG. 1(b) is a block diagram illustrating the internal structure of the high-speed clock generator 100. The high-speed clock generator 100 comprises a rising edge detector 11 receiving the trigger signal 10a and outputting an edge detecting pulse 11a, and an asynchronous reset oscillator 12 receiving the edge detecting pulse 11a and outputting a high-speed clock 12a.

Figure 2:
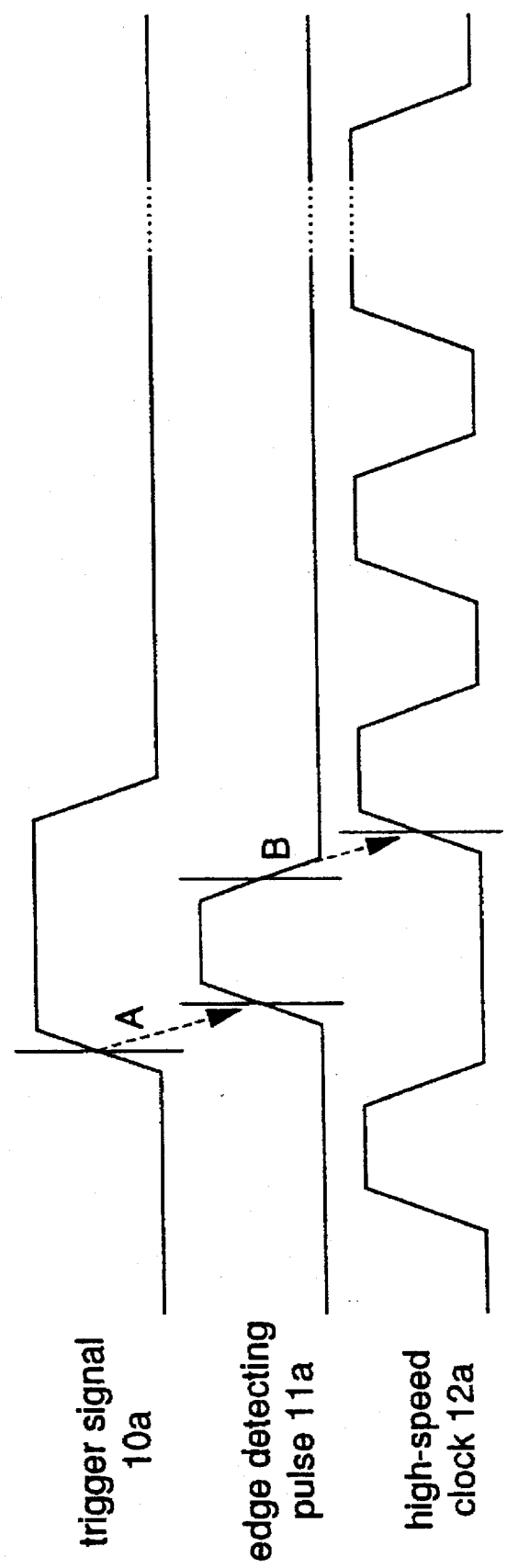
FIG. 2 is a timing chart for explaining the operation of the high-speed clock generator according to the first embodiment of the present invention.

The operation of the high-speed clock generator 100 will be described using a timing chart shown in FIG. 2.

The rising edge detector 11 detects a rising edge (point A in FIG. 2) of the trigger signal 10a, which is a sizing signal of the delay operation of the variable delay circuit 600, and generates the edge detecting pulse 11a having a prescribed pulse width.

Next, the asynchronous reset oscillator 12 is reset with the edge detecting pulse 11a. It is important to asynchronously reset the oscillator regardless of the operating state of the oscillator. The asynchronous reset oscillator 12 maintains the low (hereinafter referred to as "L") state when the edge detecting pulse 11a is in the high (hereinafter referred to as "H") state. When the edge detecting pulse 11a changes to the "L" state (point B in FIG. 2), the oscillation starts.

In the variable delay circuit according to first embodiment of the invention, since the high-speed clock generator 100 comprises the rising edge detector 11 that detects the rising edge of the trigger signal 10a, and the asynchronous reset oscillator 12 that is reset by the rising of the edge detecting pulse 11a generated in the rising edge detector 11 and starts to generate the high-speed clock when the edge detecting pulse 11a falls. In this structure, the high-speed clock generator 100 comprises only digital circuits. Since the high-speed clock generator 100 includes no PLL, it is not necessary to provide analog circuits, such as a charge pump and a VCO, on a digital LSI, so that the integration of the variable delay circuit on the digital LSI is facilitated.

In the description of the operation of the high-speed clock generator, even when the rising and the falling of the pulse are inverted and the "L" state and the "H" state are inverted, as long as the high-speed clock generator achieves an operation logically equivalent to the above-described operation, it is within the scope of the present invention. For example, the edge detecting pulse may detect a falling edge of the trigger signal whereas it detects a rising edge of the trigger signal in this first embodiment.

[Embodiment 2]

Figure 3:
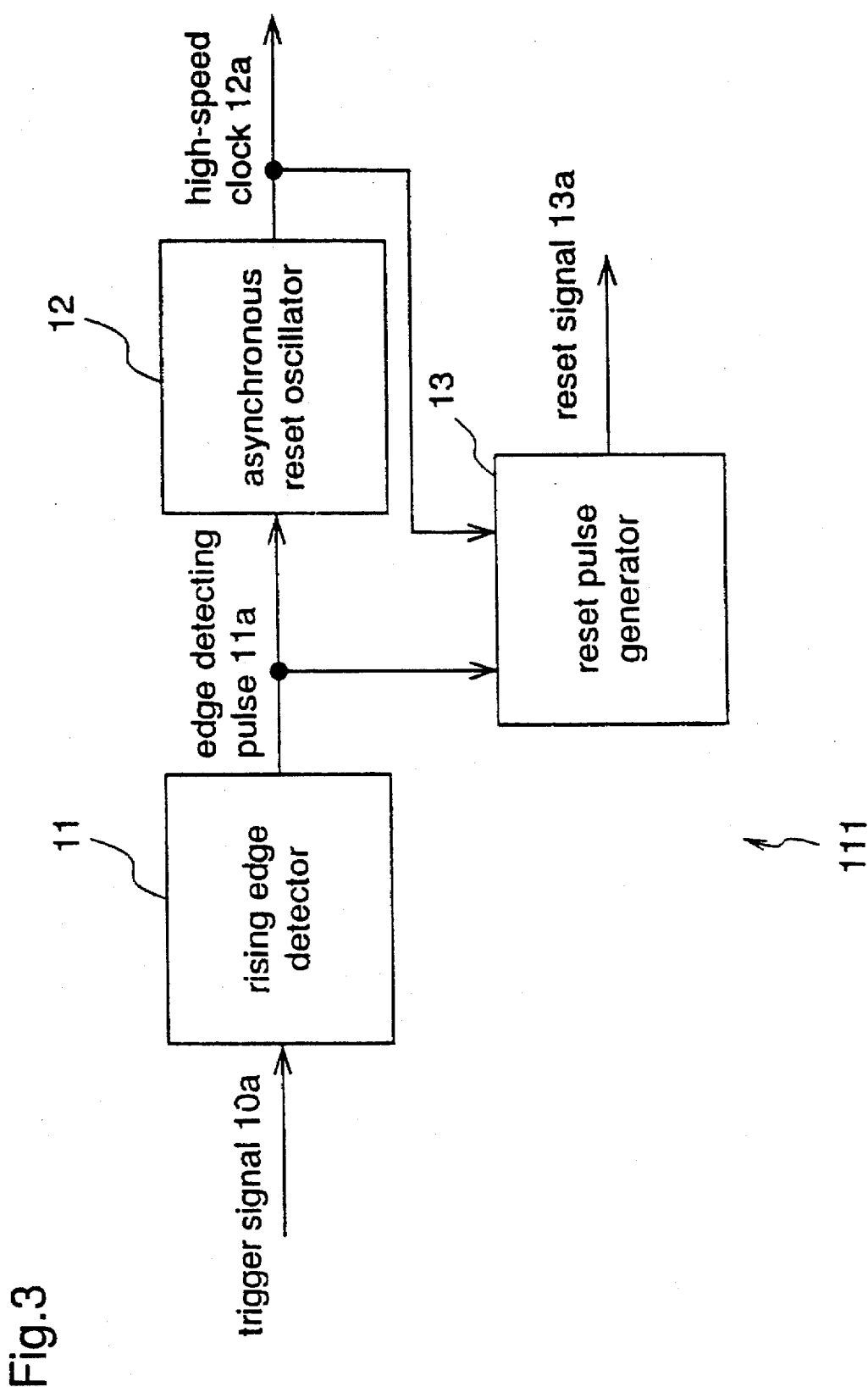
FIG. 3 is a block diagram illustrating a resettable high-speed clock generator in accordance with a second embodiment of the present invention.

FIG. 3 is a block diagram illustrating a high-speed clock generator in accordance with a second embodiment of the present invention. The high-speed clock generator 111 comprises a rising edge detector 11 detecting a rising edge of a trigger signal 10a and producing an edge detecting pulse 11a, an asynchronous reset oscillator 12 receiving the edge detecting pulse 11a and producing a high-speed clock 12a, and a reset pulse generator 13 receiving the edge detecting pulse 11a and the high-speed clock 12a and outputting a reset signal 13a.

Figure 4:
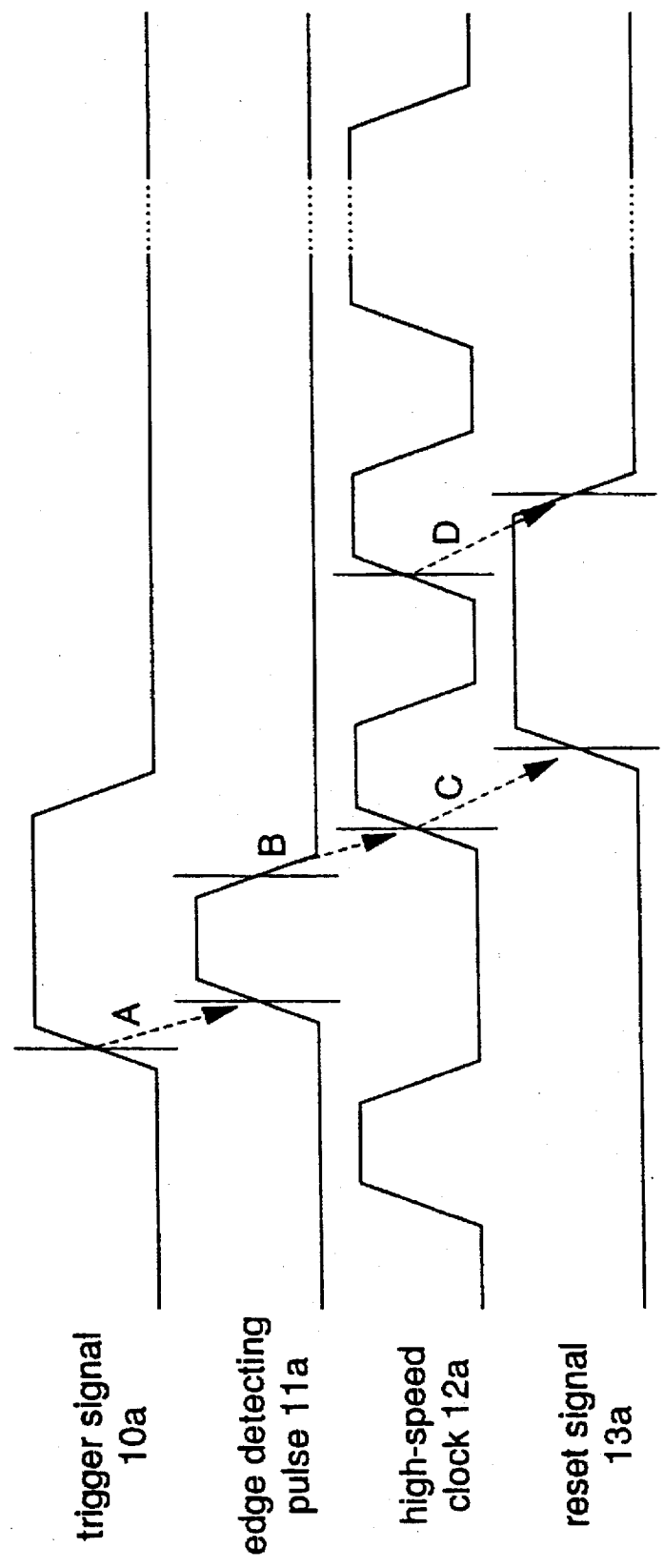
FIG. 4 is a timing chart for explaining the operation of the resettable high-speed clock generator according to the second embodiment of the present invention.

The operation of the high-speed clock generator 111 will be described using a timing chart shown in FIG. 4. Since the operation of the rising edge detector and the asynchronous reset oscillator 12 is identical to that already described in the first embodiment, repeated description is not necessary.

The reset pulse generator 13 generates a reset signal 13a for resetting the coarse delay signal generator (not shown) connected to the output end of the high-speed clock generator 111. After the falling of the edge detecting pulse 11a, the reset signal 13a rises synchronously with the rising of the first high-speed clock signal 12a (point C in FIG. 4), and the reset signal 13a falls synchronously with the rising of the second high-speed clock signal 12a (point D in FIG. 4).

In this second embodiment of the invention, since the high-speed clock generator 111 includes the reset pulse generator 13 for resetting the subsequent coarse delay signal generator, the control of the coarse delay signal generator is facilitated compared to the high-speed clock generator according to the first embodiment of the invention.

Figure 5:
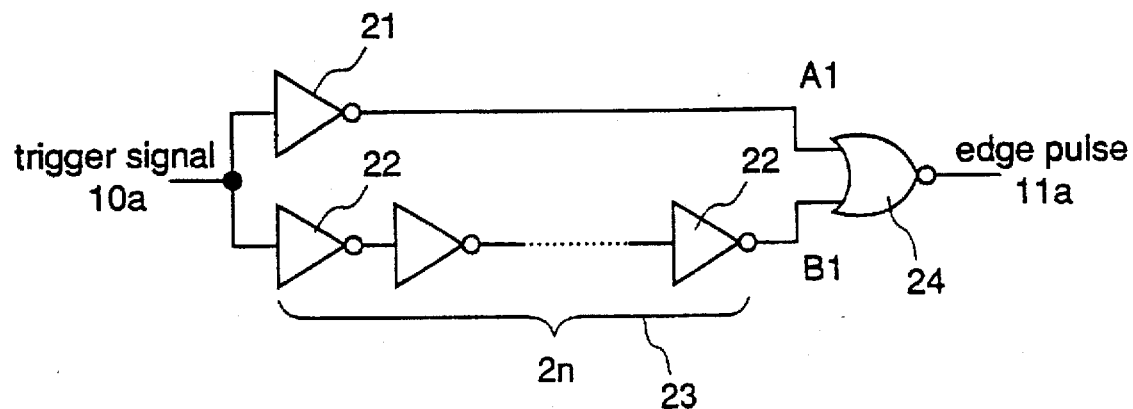
FIG. 5 is a diagram illustrating a rising edge detector used in the first and second embodiments of the present invention.

FIG. 5 is a circuit diagram illustrating the rising edge detector 11 employed in the variable delay circuits according to the first and second embodiments of the invention.

The rising edge detector 11 comprises an inverter 21, an inverter chain 23 comprising an even number (2n) of inverters 22, and a two-input NOR circuit 24. A common trigger signal 10a is applied to the input terminals of the inverter 21 and the inverter chain 23, output signals from the inverter 21 and the inverter chain 23 are applied to the input terminates of the two-input NOR circuit 24, and an edge detecting pulse 11a is output from the NOR circuit 24.

Figure 6:
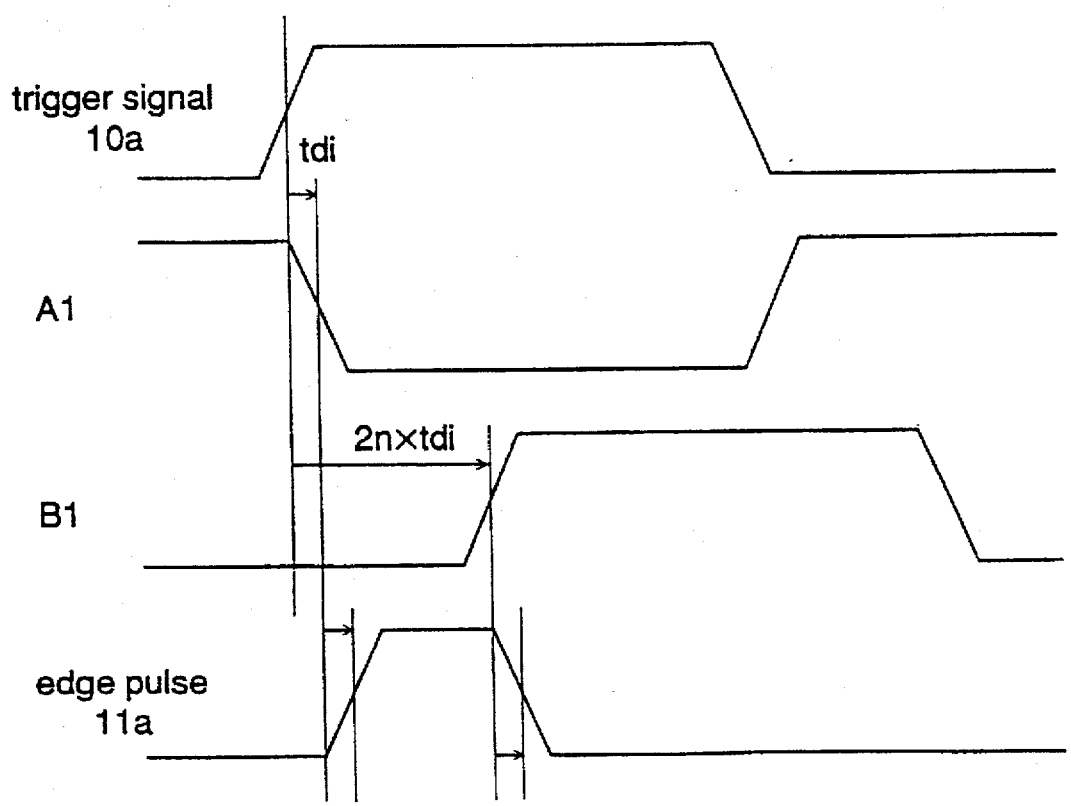
FIG. 6 is a timing chart for explaining the operation of the rising edge detector shown in FIG. 5.

The operation of the rising edge detector 11 will be described using a timing chart shown in FIG. 6. When the trigger signal 10a is input, an inverted signal appears at the output point A1 of the inverter 21 after the delay time tdi of the inverter 21. On the other hand, at the output point B1 of the inverter chain 23, a non-inverted signal appears after 2n×tdi (2n: number of the inverters included in the inverter chain). Therefore, an edge detecting pulse 11a having a pulse width of (2n−1)×tdi is output from the two-input NOR 24.

As described above, the edge detector 11 generates the edge detecting pulse 11a by making a logical sum of the two signals having reciprocal outputs and different delay times. Further, the edge detector 11 generates an edge detecting pulse having a desired pulse width even though a trigger signal having an arbitrary pulse width is input.

[Embodiment 3]

Figure 7:
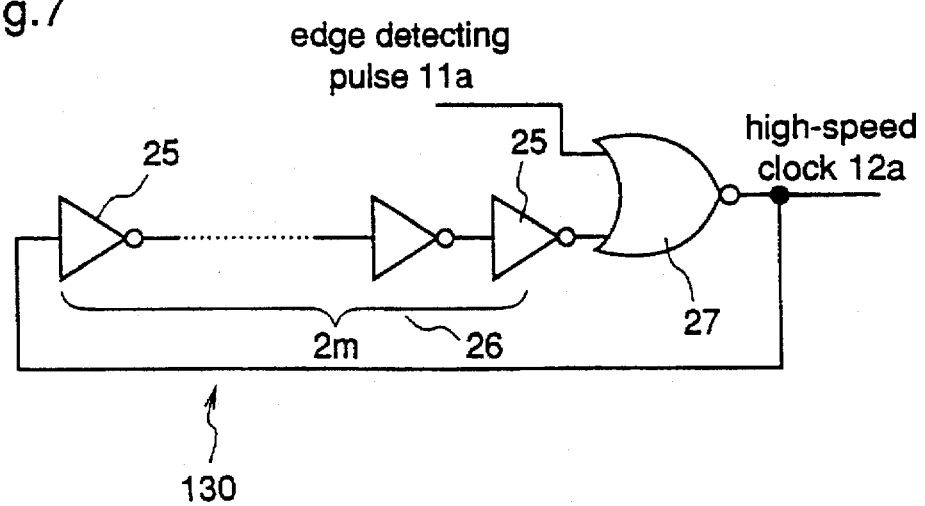
FIG. 7 is a diagram illustrating an asynchronous reset oscillator in accordance with a third embodiment of the present invention.

FIG. 7 is a diagram illustrating an asynchronous reset oscillator in accordance with a third embodiment of the present invention.

The asynchronous reset oscillator 130 comprises an inverter chain 26 and a two-input NOR circuit 27. The inverter chain 26 comprises an even number (2m) of inverters 25 connected in series. The two-input NOR circuit 27 has a first input terminal to which an output from the inverter chain 26 is applied and a second input terminal to which an edge detecting pulse 11a is applied, produces a logical sum of these signals, and outputs a high-speed clock 12a. An output terminal of the two-input NOR circuit 27 is connected to an input terminal of the inverter chain 26.

Figure 8:
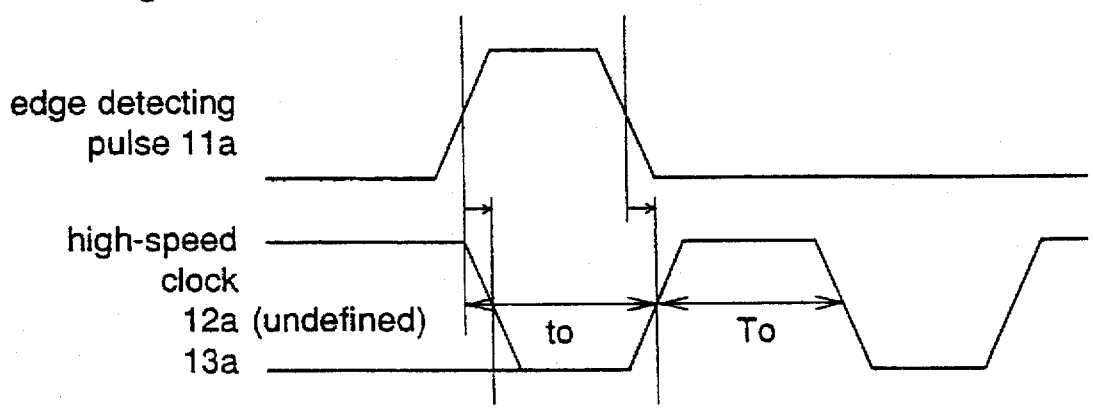
FIG. 8 is a timing chart for explaining the operation of the asynchronous reset oscillator shown in FIG. 7.

FIG. 8 is a timing chart for explaining the operation of the asynchronous reset oscillator 130. When the edge detecting pulse 11a is in the "H" state, the output from the two-input NOR circuit 27 is in the "L" state, and the oscillator is reset regardless of the state of the oscillator. That is, asynchronous reset operation is performed. After a sufficient time interval, i.e., after the output from the two-input NOR circuit 27 is transmitted through the inverters 25 and the output from each inverter 25 is settled, when the edge detecting pulse 11a becomes "L", the asynchronous reset oscillator 130 starts ring oscillation. Thereafter, it continues self-running oscillation at a natural period and outputs the high-speed clock 12a.

In this third embodiment of the invention, the asynchronous reset oscillator employed in the first or second embodiment of the invention is realized by only digital circuits without using an analog oscillator, such as a VCO.

[Embodiment 4]

Figure 9:
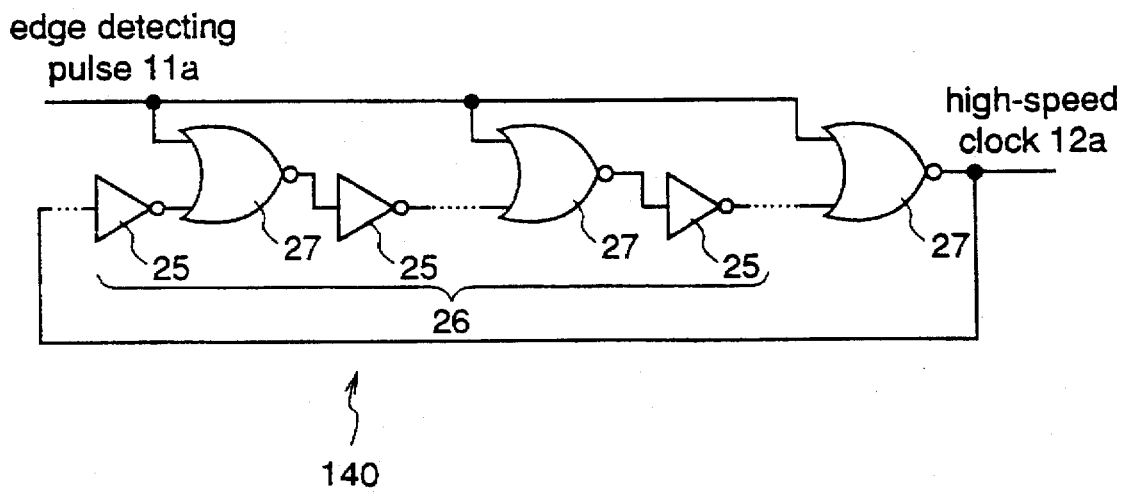
FIG. 9 is a diagram illustrating an asynchronous reset oscillator with plural reset gates in accordance with a fourth embodiment of the present invention.

FIG. 9 is a diagram illustrating an asynchronous reset oscillator in accordance with a fourth embodiment of the present invention.

The asynchronous reset oscillator 140 comprises an inverter chain 26 in which a plurality of two-input NOR circuits 27 are inserted between a plurality of inverters 25, and a common edge detecting pulse 11a is applied to the two-input NOR circuits 27. The inverter chain 26 comprising the inverters 25 and the two-input NOR circuits 27 provides a ring oscillator that outputs a high-speed clock 12a.

The operation of the asynchronous reset oscillator 140 is fundamentally identical to the operation of the asynchronous reset oscillator 130 according to the third embodiment of the invention. In this fourth embodiment, since the two-input NOR circuits 27 for asynchronous resetting are inserted in the inverter chain 26, when the oscillation frequency of the asynchronous reset oscillator 140 is equal to the oscillation frequency of the asynchronous reset oscillator 130, which oscillation frequencies depend on the delay time T0 of the inverter chain 26, the time interval t0 required for resetting the asynchronous reset oscillator 140 is reduced, whereby the pulse width of the edge detecting pulse 11a is reduced. The reduction in the pulse width results in fast output of the high-speed clock 12a. Therefore, the asynchronous reset oscillator 140 according to this fourth embodiment is superior in the operating speed to the asynchronous reset oscillator 130 according to the third embodiment.

When the inverters 25 and the two-input NOR circuits 27 are alternatingly connected in the inverter chain 26, the asynchronous reset oscillator outputs a most stable high-speed clock 12a.

[Embodiment 5]

Figure 10:
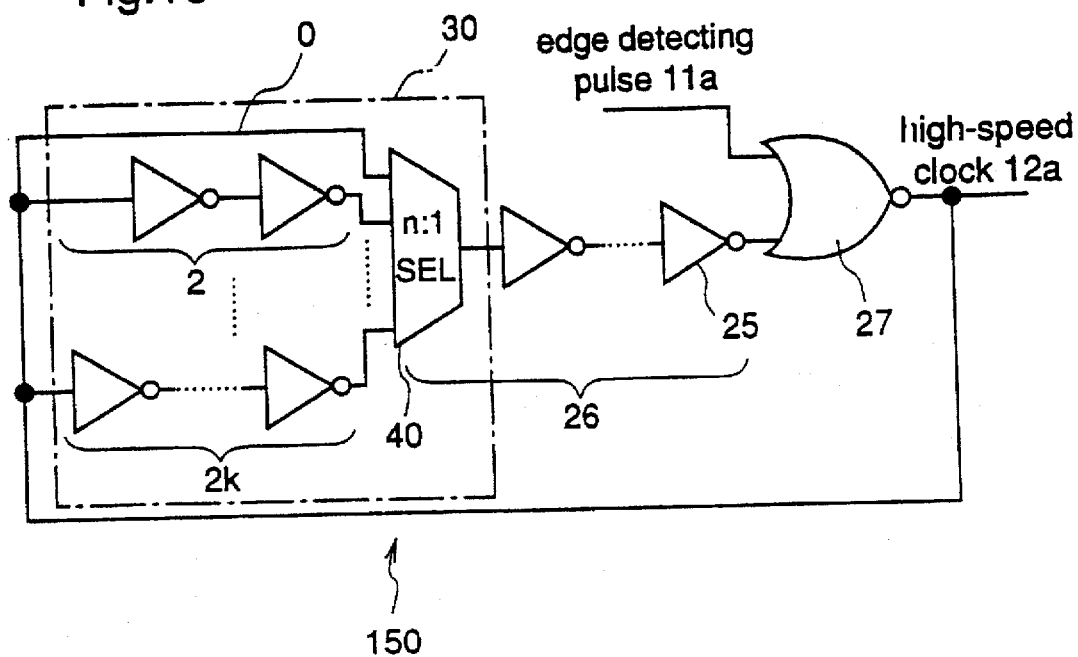
FIG. 10 is a diagram illustrating an asynchronous reset oscillator with a frequency variable circuit in accordance with a fifth embodiment of the present invention.

FIG. 10 is a diagram illustrating an asynchronous reset oscillator in accordance with a fifth embodiment of the present invention.

The asynchronous reset oscillator 150 according to this fifth embodiment is fundamentally identical to the asynchronous reset oscillator 130 according to the third embodiment except that a part of the inverter chain 26 is replaced with a delay time changing means 30. The delay time changing means 30 comprises a plurality of inverter chains, each inverter chain comprising an even number of inverters 0, 2, ..., 2k, and an n:1 selector 40 selecting one of the inverter chains.

In this fifth embodiment of the invention, since the asynchronous reset oscillator 150 includes the delay time changing means 30, this delay time of the inverter chain 26 is controlled with the delay time changing means 30, whereby the oscillation frequency of the high-speed clock 12a can be varied.

[Embodiment 6]

Figure 11:
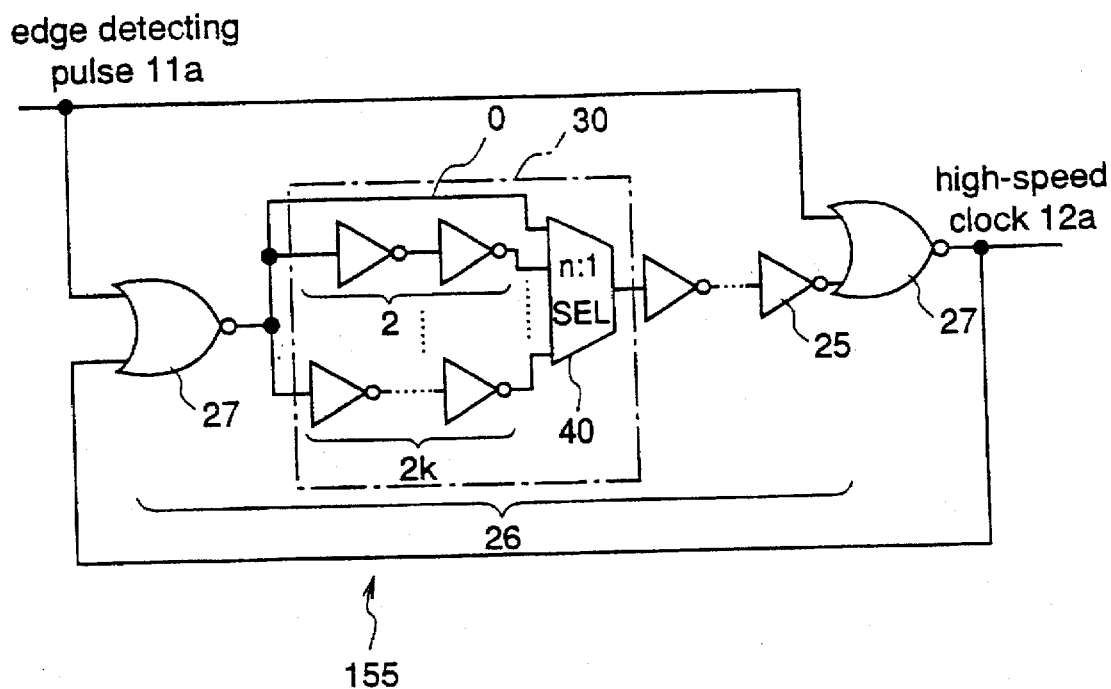
FIG. 11 is a diagram illustrating an asynchronous reset oscillator with plural reset gates and a frequency variable circuit in accordance with a sixth embodiment of the present invention.

FIG. 11 shows an asynchronous reset oscillator 155 in accordance with a sixth embodiment of the present invention.

The asynchronous reset oscillator 155 according to this sixth embodiment is fundamentally identical to the asynchronous reset oscillator 130 according to the third embodiment except that a part of the inverter chain 26 is replaced with at least a delay time changing means 30 and at least a two-input NOR circuit 27 for asynchronous resetting which are connected in series.

In this sixth embodiment, the oscillation frequency of the high-speed clock 12a can be changed. In addition, since the pulse width of the edge detecting pulse 11a is shortened, fast output of the high-speed clock 12a is achieved, whereby the operating speed of the asynchronous reset oscillator is increased.

When a part of the inverter chain 26 is replaced with a plurality of delay time changing means 30 and a plurality of two-input NOR circuits 27 which are alternatingly connected in series, the asynchronous reset oscillator 155 outputs a most stable high-speed clock 12a.

In the above-described third to sixth embodiments, emphasis has been placed upon an asynchronous reset oscillator including an inverter chain and a two-input NOR circuit. However, the asynchronous reset oscillator according to the present invention is not restricted thereto. For example, the inverter chain may be replaced with other delay means as long as it performs a ring oscillation with the same effects as described above.

[Embodiment 7]

Figure 12:
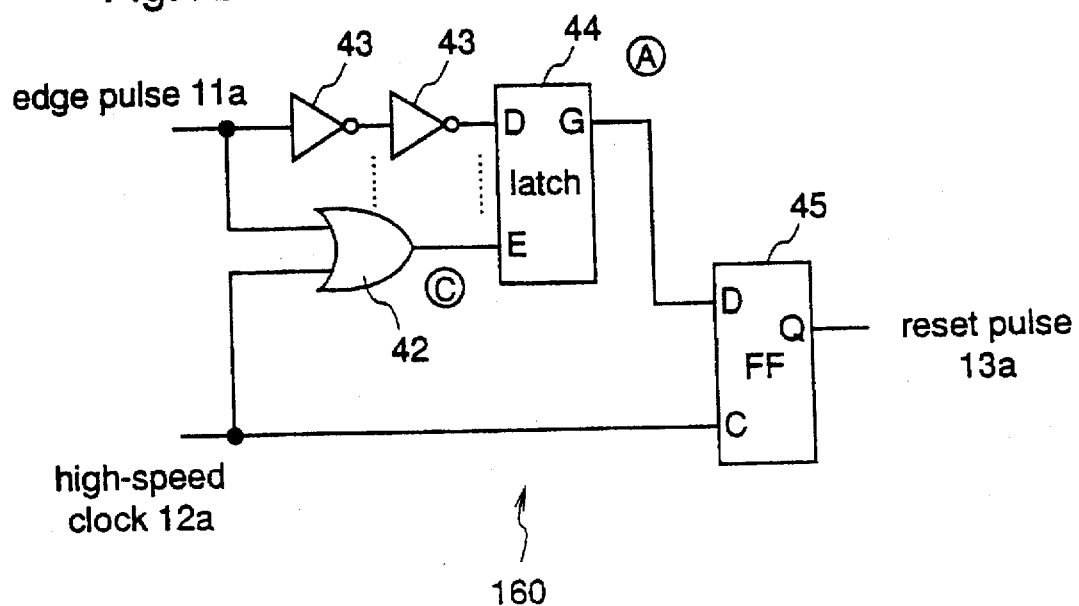
FIG. 12 is a diagram illustrating a reset pulse generator in accordance with a seventh embodiment of the present invention.

FIG. 12 is a diagram illustrating a reset pulse generator in accordance with a seventh embodiment of the present invention.

The reset pulse generator 160 according to this seventh embodiment comprises a two-input OR circuit 42 to which an edge detecting pulse 11a and a high-speed clock signal 12a are input, two inverters 43, a latch circuit 44 having a data input to which the edge detecting pulse 11a is applied through the inverters 43 and an enable input to which an output signal from the two-input OR circuit 42 is applied, and a flip-flop 45 having a data input to which an output signal from the latch circuit 44 is applied and a clock input to which the high-speed clock signal 12a is applied and outputting a reset pulse 13a.

Figure 13:
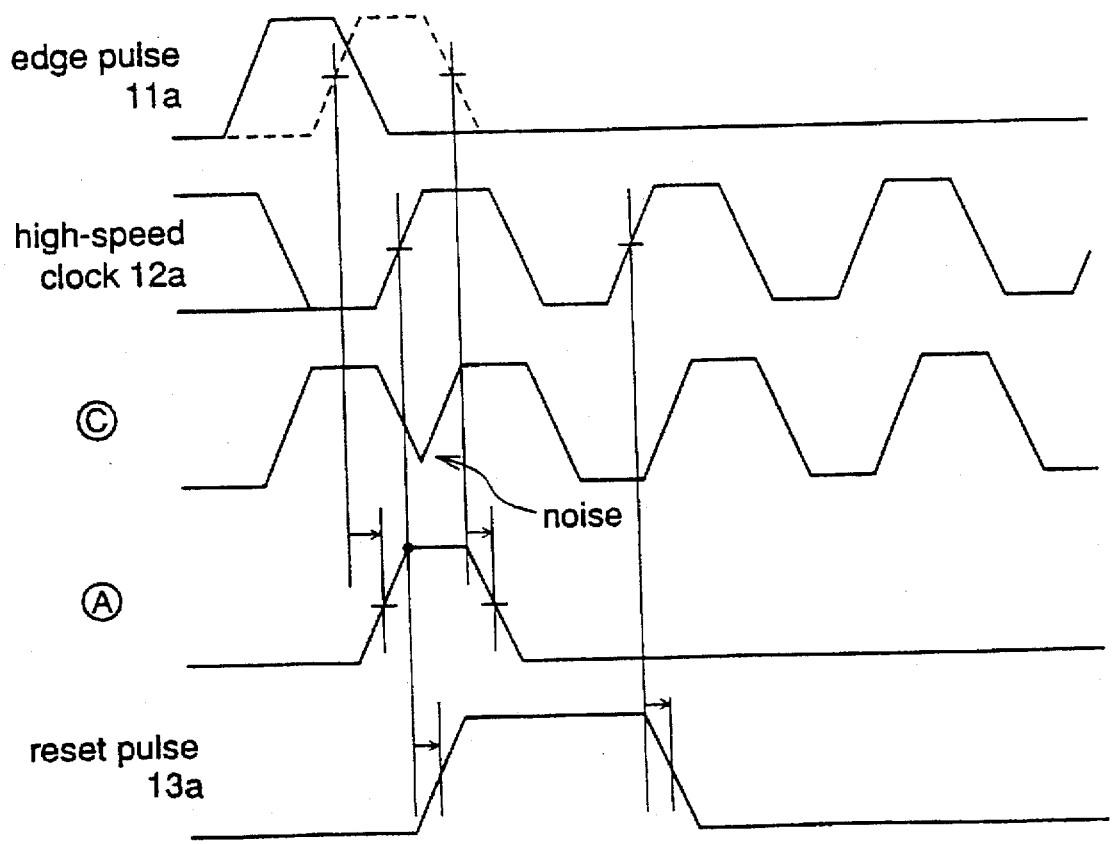
FIG. 13 is a timing chart for explaining the operation of the reset pulse generator shown in FIG. 12.

FIG. 13 is a timing chart for explaining the operation of the reset pulse generator 160.

At an output point C of the OR circuit 42 that produces a logical sum of the edge detecting pulse 11a and the high-speed clock 12a, there is a possibility of generation of noise as shown in a waveform at the point C. However, the output signal from the OR circuit 42 is input to the latch 44 of HIGH-Enable type that passes data when the enable terminal is "H" and holds the data when the enable terminal is "L", and the edge detecting pulse 11a which is delayed by the inverters 43 (dotted line in FIG. 13) is output at the output point A of the latch 44 without being adversely affected by noise. Therefore, when the output signal at the point A is taken in the flip-flop 45 with the high-speed clock 12a, a reset pulse 45a synchronized with the high-speed clock 12a is obtained as shown in FIG. 13.

In the reset pulse generator 160 according to the seventh embodiment of the invention, the reset pulse 13a for resetting the subsequent coarse delay signal generator (not shown) is produced in response to the edge detecting pulse 11a within the high-speed clock generator, so that control of the variable delay circuit is facilitated.

Figure 14:
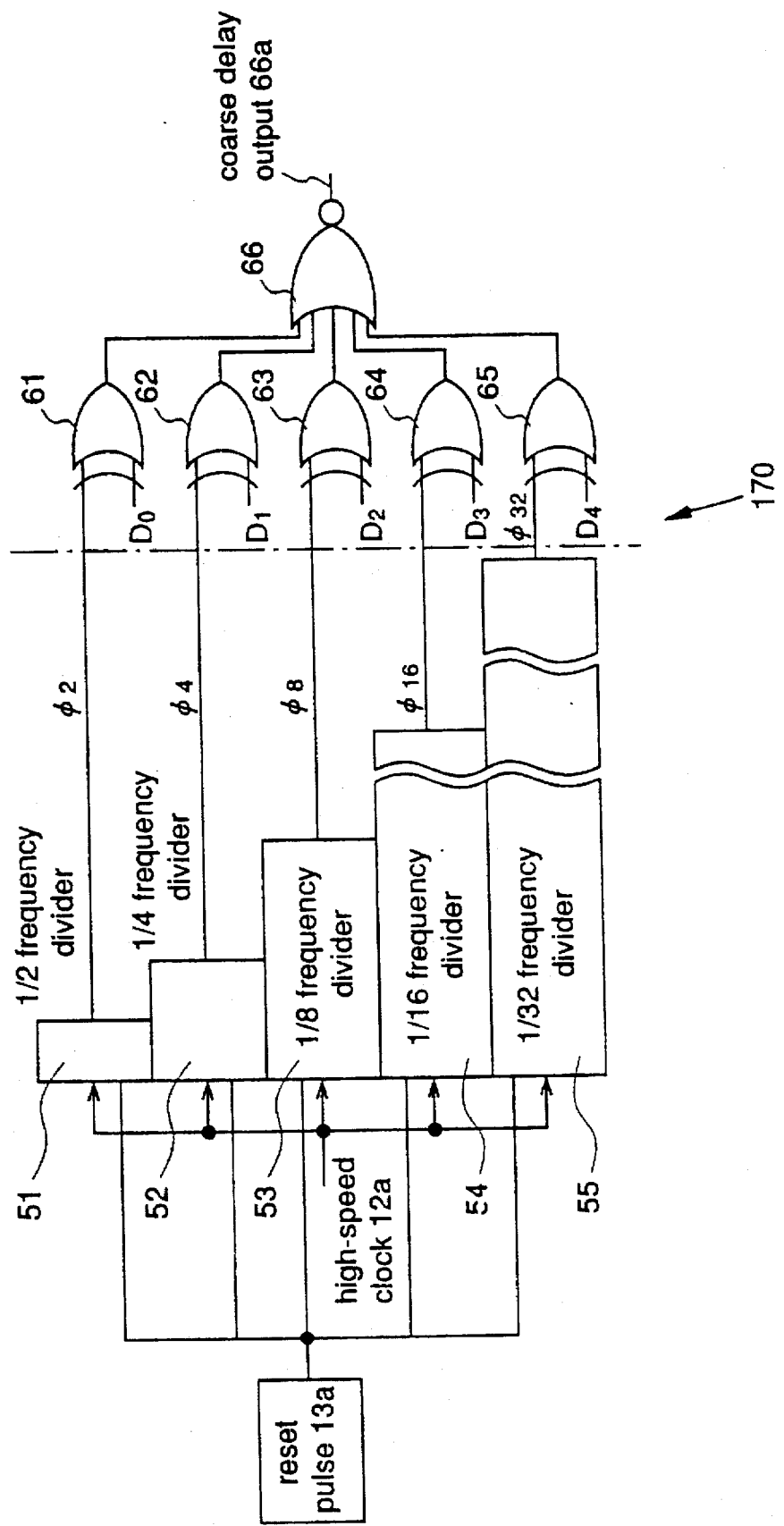
FIG. 14 is a diagram illustrating additional coarse delay signal generator employed in the circuits according to the first to sixth embodiments of the invention.

FIG. 14 is a diagram illustrating a coarse delay signal generator used in the variable delay circuits according to the first to seventh embodiments of the invention. The coarse delay signal generator 170 comprises ½, ¼, ⅛, ⅙, and 1/32 (½$^N$) frequency dividers 51, 52, 53, 54, and 55 outputting signals ø2, ø4, ø8, ø16, and ø32, respectively, five exclusive OR circuits 61, 62, 63, 64, and 65 having first input terminals to which the signals ø2, ø4, ø8, ø16, and ø32 are applied, respectively, and second input terminals to which data signals D0, D1, D2, D3, and D4 are applied, respectively, and a five-input NOR circuit 66 to which output signals from the exclusive OR circuits 61, 62, 63, 64, and 65 are input. In addition, a reset pulse 13a is applied to the respective frequency dividers 51 to 55.

Figure 15:
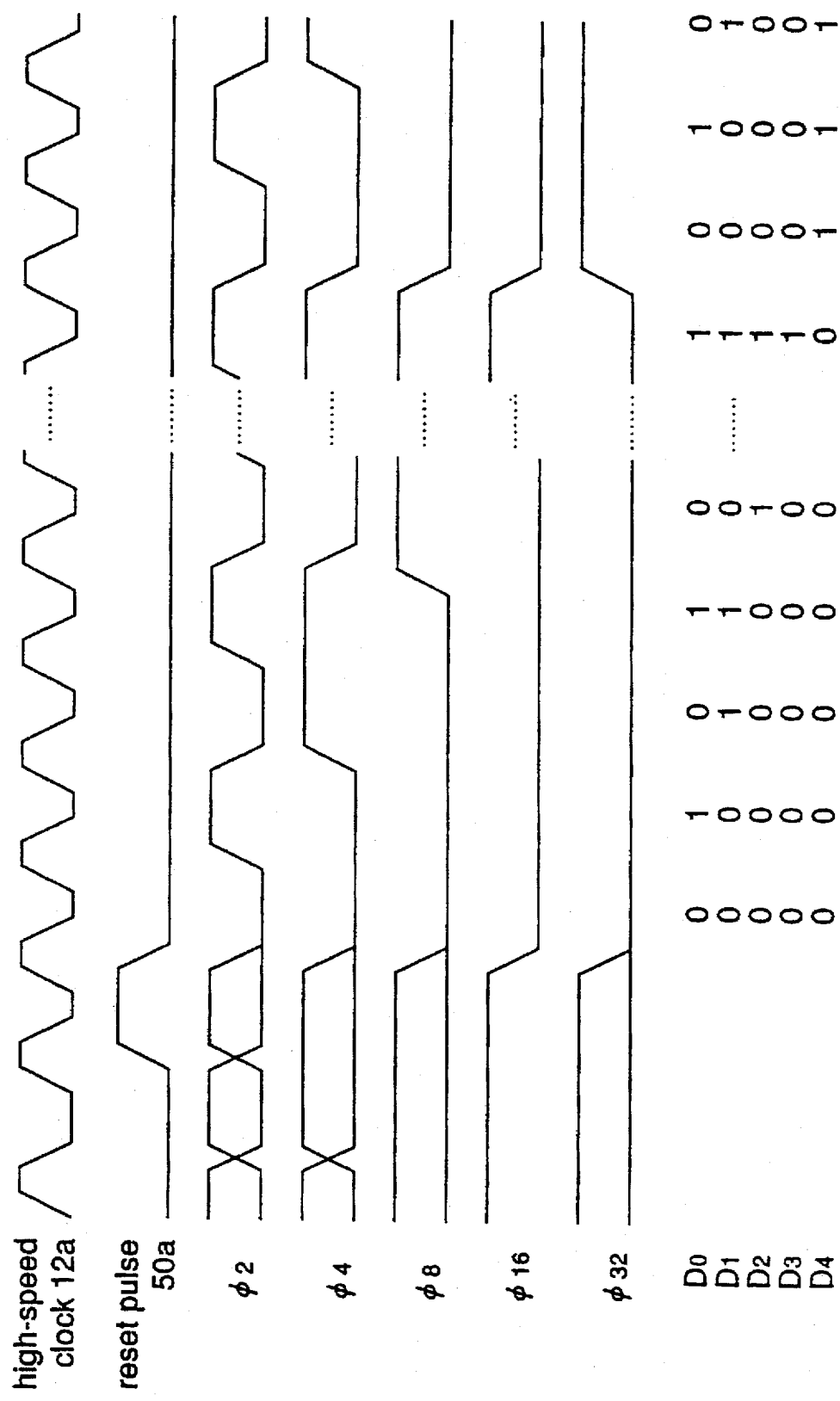
FIG. 15 is a timing chart for explaining the operation of the coarse delay signal generator shown in FIG. 14.

The operation of the coarse delay signal generator 170 will be described using a timing chart shown in FIG. 15. In FIG. 15, when the reset pulse 13a is applied, the respective frequency dividers 51 to 55 are reset to initial values. Thereafter, when the high-speed clock pulse 12a is applied, the respective frequency dividers 51 to 55 start frequency dividing. As shown in the lower part of FIG. 15, the signals ø2 to ø32 after the resetting are in the 5 bit binary sequence, and a coarse delay output 66a is output from the five-input NOR circuit 66 by setting the data signals D0 to D4 at desired delay values. For example, when a delay of three clocks after the resetting is designated to the input terminals of the exclusive OR circuits by setting the data signals D4, D3, D2, D1, and D0 as (D4,D3,D2,D1,D0)=(00011), in the coarse delay signal generator 170, the input signals to the exclusive OR circuits 61 to 65 coincide with each other when the signals ø2 and ø4 are 1 and other signals are 0, i.e., after three clocks after the resetting, whereby the output signal from the five-input NOR circuit 66 becomes "H".

In this coarse delay signal generator 170, only five delay output lines for the output signals ø2, ø4, ø8, ø16, and ø32 are required whereas sixty-four lines are required in the prior art circuit, which means that the number of the delay output lines is significantly reduced. In addition, a highly precise coarse delay signal 66a is produced.

Figure 16:
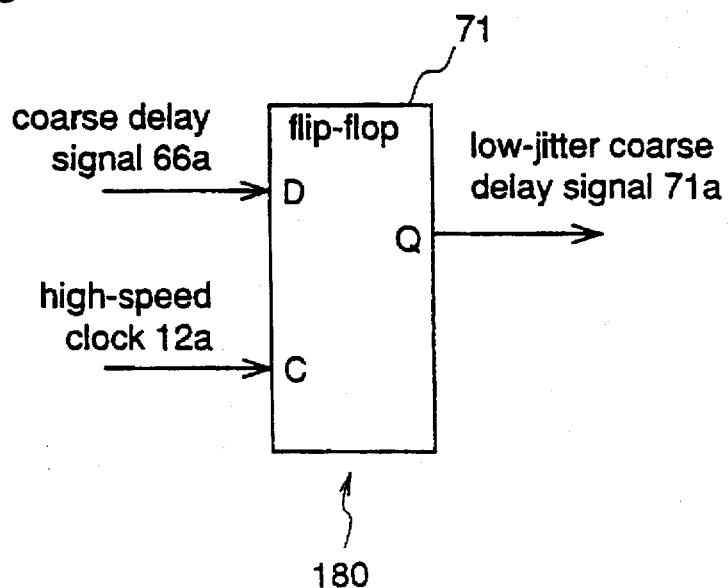
FIG. 16 is a diagram illustrating a low-jitter coarse delay signal generator employed in the circuits according to the first to sixth embodiments of the invention.

FIG. 16 is a diagram illustrating another coarse delay signal generator employed in the variable delay circuits according to the first to seventh embodiments of the present invention.

The coarse delay signal generator 180 is obtained by connecting a jitter reducing means 71 for reducing the jitter of the coarse delay signal 66a to the output terminal of the coarse delay signal generator 170 shown in FIG. 14.

In FIG. 16, the jitter reducing means 71 comprises a flip-flop having a data input to which the output signal 66a from the coarse delay signal generator 170 is applied and a clock input to which the high-speed clock 12a is applied, and a low-jitter coarse delay signal 71a is output from the flip-flop 71.

At the output terminal of the coarse delay signal generator 170 shown in FIG. 14, a jitter corresponding to the difference in transmission time intervals of the respective gates remains although it is less than the jitter in the coarse delay signal generator 122 according to the prior art. When the jitter reducing means 71 is connected to the coarse delay signal generator, a low-jitter coarse delay signal 71a synchronized with the clock signal 12a is obtained.

Figure 18:
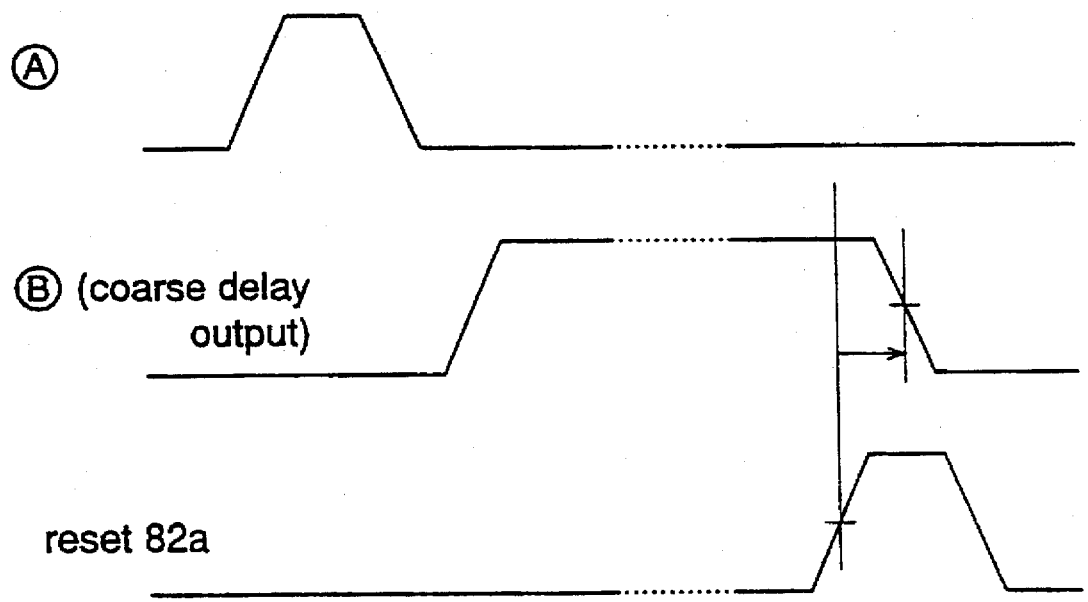
FIG. 18 is a timing chart for explaining the operation of the coarse delay signal generator shown in FIG. 14, the low-jitter coarse delay signal generator shown in FIG. 16, and the resettable coarse delay signal generator shown in FIG. 18.
Figure 19:
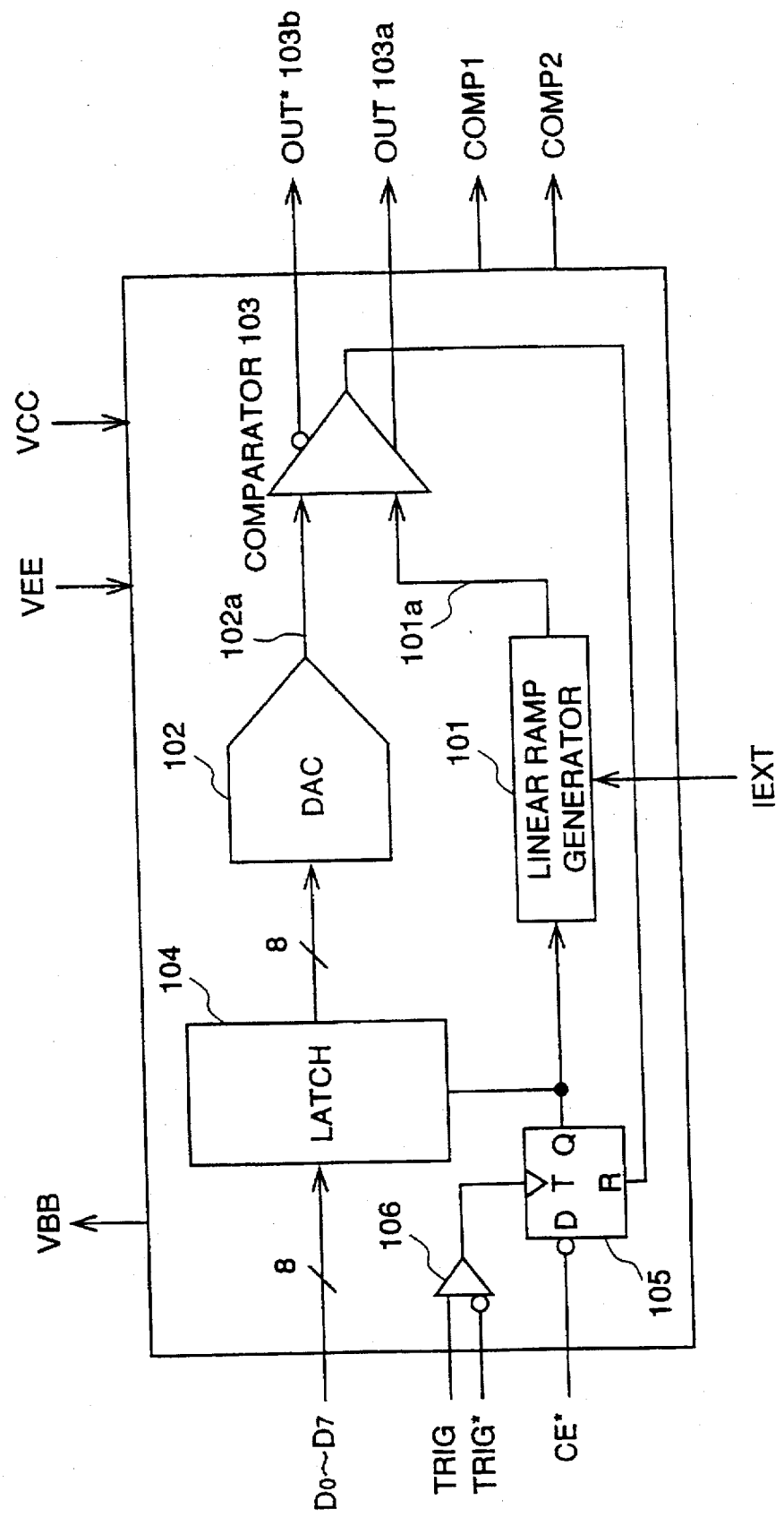
FIG. 19 is a block diagram illustrating an analog variable delay circuit according to the prior art.
Figure 20:
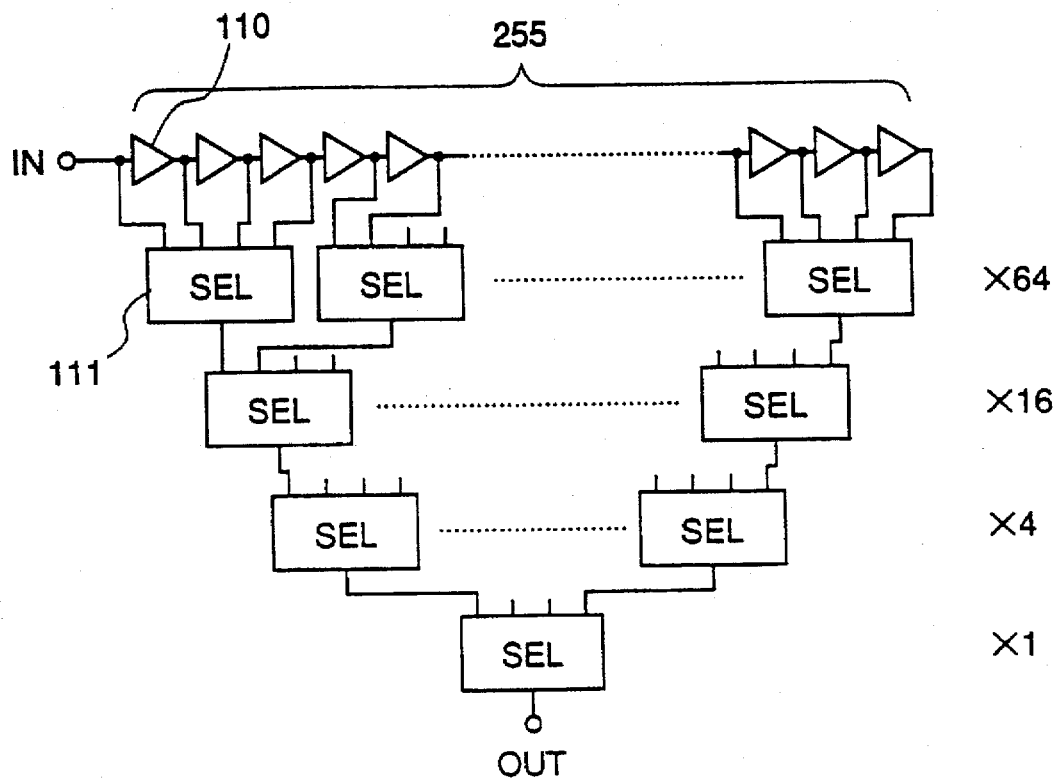
FIG. 20 is a block diagram illustrating a digital variable delay circuit according to the prior art.
Figure 21:
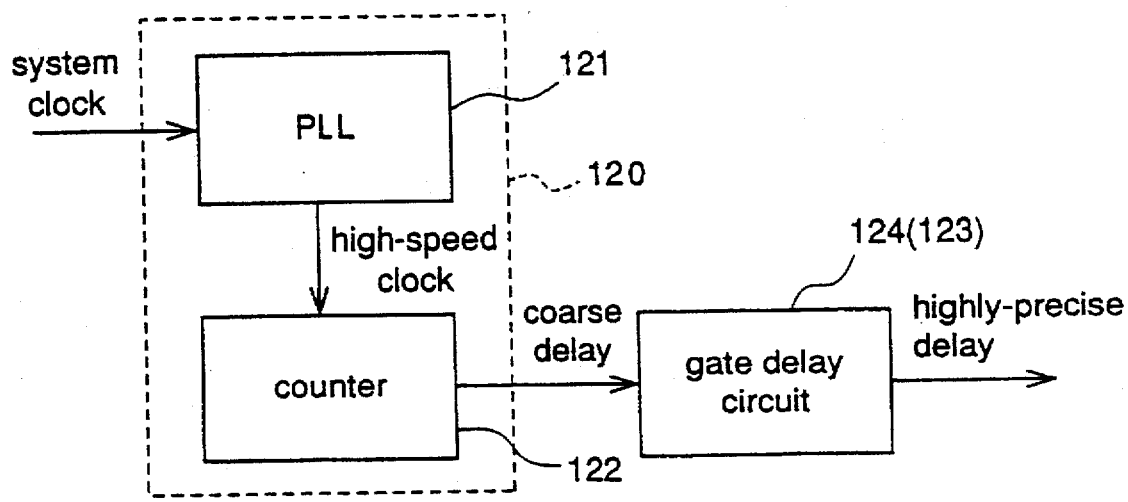
FIG. 21 is a block diagram illustrating a digital variable delay circuit according to the prior art.
Figure 22:
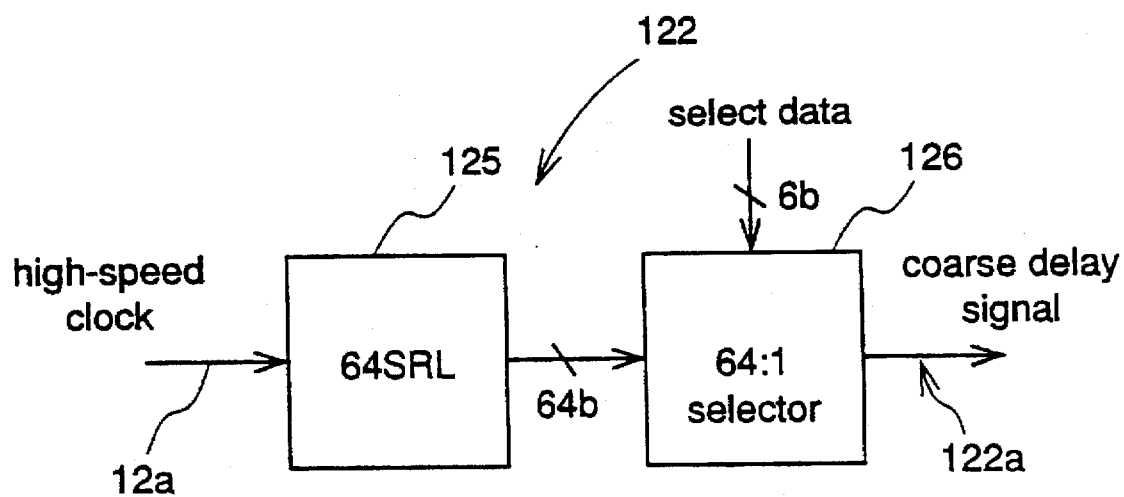
FIG. 22 is a block diagram illustrating a counter according to the prior art.

As shown in FIG. 18, a coarse delay signal output waveform A of the coarse delay signal generators 170 and 180 is a pulse waveform having a width corresponding to one period of the high-speed clock 12a.

[Embodiment 8]

Figure 17:
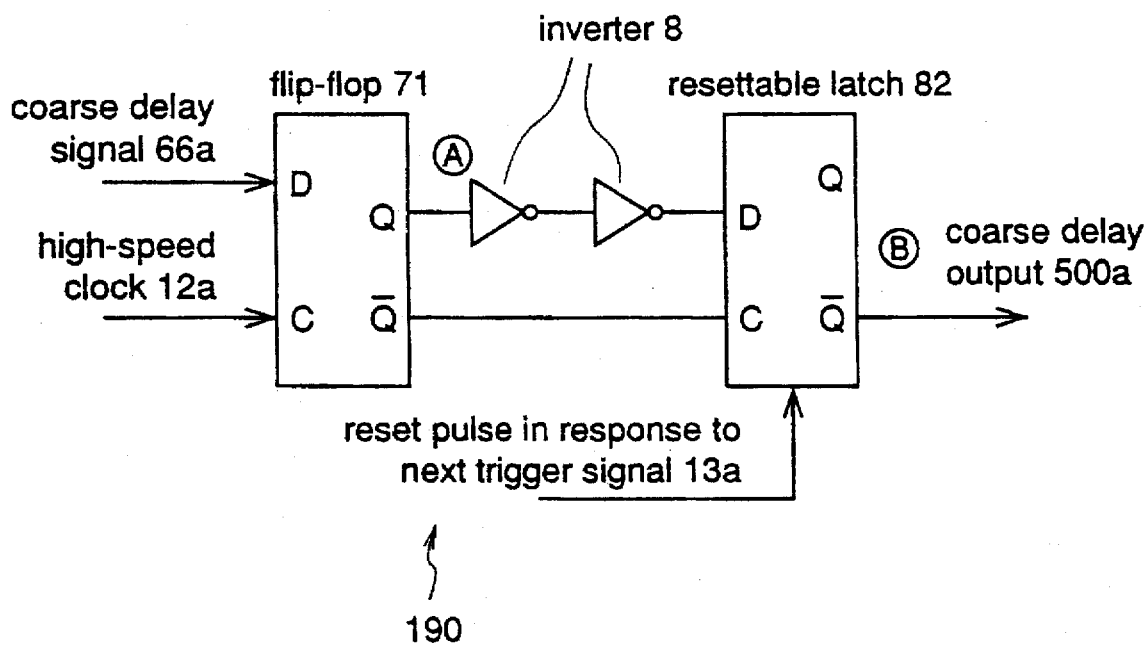
FIG. 17 is a diagram illustrating a resettable coarse delay signal generator in accordance with an eighth embodiment of the present invention.

FIG. 17 is a diagram illustrating a coarse delay signal generator in accordance with an eighth embodiment of the present invention.

The coarse delay signal generator 190 according to this eighth embodiment is obtained by connecting a resettable latch 82 to the output terminal of the jitter reducing means 71 of the coarse delay signal generator 180 shown in FIG. 16 through a delay element comprising two inverters 8. The resettable latch 82 has a data input to which an output signal from the jitter reducing means 71 is applied and a clock input to which an inverted signal of the output signal from the jitter reducing means 71 is applied, and outputs a coarse delay output 500a.

In operation, the output from the jitter reducing means 71 comprising a flip-flop is latched by the resettable latch 82 to maintain the coarse delay output 500a in the "H" state. On the other hand, the coarse delay output 500a is reset to the "L" state by the reset pulse 13a which is output from the reset pulse generator 160 in response to the next trigger signal 10a.

In this eighth embodiment of the present invention, since the resettable latch 82 for resetting of the output from the coarse delay signal generator 180 by the reset pulse 13a in response to the next trigger signal 10a is connected to the output terminal of the jitter reducing means 71 of the coarse delay signal generator 180, a coarse delay output waveform B, shown in FIG. 18, that maintains the "H" state after a desired delay and is reset to the "L" state by the next reset pulse 13a is obtained.

What is claimed is:

1. A variable delay circuit comprising:
   a high-speed clock generator receiving a trigger signal and outputting a high-speed clock after a time delay upon rising of the trigger signal, the high-speed clock generator comprising:
   a rising edge detector receiving the trigger signal, detecting a rising edge of the trigger signal, and, in response, outputting an edge detecting pulse having a time interval; and
   an asynchronous reset oscillator receiving the edge detecting pulse, resetting upon rising of the edge detecting pulse, and generating the high-speed clock upon falling of the edge detecting pulse; and
   a coarse delay signal generator receiving the high-speed clock and outputting a coarse delay output, wherein the high-speed clock generator includes a reset pulse generator connected for receiving the edge detecting pulse from the rising edge detector and the high-speed clock from the asynchronous reset oscillator, and outputting a reset signal for resetting the coarse delay signal generator.

2. The variable delay circuit of claim 1 wherein the asynchronous reset oscillator comprises:
   an inverter chain comprising an even number of inverters connected in series, the inverter chain having input and output terminals; and
   a two-input NOR circuit having a first input terminal connected to the output terminal of the inverter chain, a second input terminal connected for receiving the edge detecting pulse from the rising edge detector, and an output terminal connected to the input terminal of the inverter chain, the NOR circuit outputting the high-speed clock.

3. A variable delay circuit comprising:
   a high-speed clock generator receiving a trigger signal and outputting a high-speed clock after a time delay upon rising of the trigger signal, the high-speed clock generator comprising:
   a rising edge detector receiving the trigger signal, detecting a rising edge of the trigger signal, and, in response, outputting an edge detecting pulse having a time interval; and
   an asynchronous reset oscillator receiving the edge detecting pulse, resetting upon rising of the edge detecting pulse, and generating a high-speed clock upon falling of the edge detecting pulse, the asynchronous reset oscillator comprising:
   an inverter chain having an input terminal and an output terminal and comprising an even number of inverters and an even number of first two-input NOR circuits connected in series, each first two-input NOR circuit having a first input terminal receiving an output from one of the inverters and a second input terminal connected for receiving the edge detecting pulse from the rising edge detector; and
   a second two-input NOR circuit having a first input terminal connected to the output terminal of the inverter chain, a second input terminal connected for receiving the edge detecting pulse from the rising edge detector, and an output terminal connected to the input terminal of the inverter chain, the second two-input NOR circuit outputting the high-speed clock and wherein the inverter chain and the second two-input NOR circuit are connected as a ring oscillator; and
   a coarse delay signal generator receiving the high-speed clock and outputting a coarse delay output.

4. The variable delay circuit of claim 3 wherein the inverters and the first two-input NOR circuits of the inverter chain are alternatingly connected in series.

5. A variable delay circuit comprising:

a high-speed clock generator receiving a trigger signal and outputting a high-speed clock after a time delay upon rising of the trigger signal, the high-speed clock generator comprising:
  a rising edge detector receiving the trigger signal, detecting a rising edge of the trigger signal, and, in response, outputting an edge detecting pulse having a time interval;
  an asynchronous reset oscillator receiving the edge detecting pulse, resetting upon rising of the edge detecting pulse, and generating a high-speed clock upon falling of the edge detecting pulse, the asynchronous reset oscillator comprising:
    delay path selecting means comprising a plurality of first inverter chains, each first inverter chain having an input terminal, an output terminal, and comprising a plurality of first inverters connected in series, and a selector for selecting one of the first inverter chains, the selector having an output terminal and a plurality of input terminals connected to the output terminals of the first inverter chains;
    a second inverter chain comprising a plurality of second inverters connected in series and having an output terminal and an input terminal connected to the output terminal of the selector; and
    a two-input NOR circuit having a first input terminal connected to the output terminal of the second inverter chain, a second input terminal connected for receiving the edge detecting pulse from the rising edge detector, and an output terminal connected to the input terminals of the first inverter chains, the NOR circuit outputting the high-speed clock; and
a coarse delay signal generator receiving the high-speed clock and outputting a coarse delay output, wherein the high-speed clock generator includes a reset pulse generator connected for receiving the edge detecting pulse from the rising edge detector and the high-speed clock from the asynchronous reset oscillator, and outputting a reset signal for resetting the coarse delay signal generator.

6. A variable delay circuit comprising:
a high-speed clock generator receiving a trigger signal and outputting a high-speed clock after a time delay upon rising of the trigger signal, the high-speed clock generator comprising:
  a rising edge detector receiving the trigger signal, detecting a rising edge of the trigger signal, and, in response, outputting an edge detecting pulse having a time interval and
  an asynchronous reset oscillator receiving the edge detecting pulse, resetting upon rising of the edge detecting pulse, and generating a high-speed clock upon falling of the edge detecting pulse, the asynchronous reset oscillator comprising:
    at least one delay path selecting means comprising a plurality of first inverter chains, each inverter chain having an input terminal and comprising a plurality of first inverters connected in series, and a selector for selecting one of the first inverter chains and having an output terminal;
    a second inverter chain comprising an even number of second inverters and an even number of first two-input NOR circuits connected in series and having an input terminal connected to the output terminal of the selector, each first two-input NOR circuit having a first input terminal connected to an output terminal of one of the second inverters and a second input terminal connected for receiving the edge detecting pulse from the rising edge detector; and
    a second two-input NOR circuit having a first input terminal connected to an output terminal of the second inverter chain, a second input terminal connected for receiving the edge detecting pulse from the rising edge detector, and an output terminal connected to the input terminal of the delay path selecting means, the second two-input NOR circuit outputting the high-speed clock wherein the delay path selecting means, the second inverter chain, and the second two-input NOR circuit are connected as a ring oscillator; and
a coarse delay signal generator receiving the high-speed clock and outputting a coarse delay output.

7. The variable delay circuit of claim 6 wherein the delay path selecting means, the first two-input NOR circuits, and the second inverters are alternatingly connected in series.

8. The variable delay circuit of claim 3 wherein the high-speed clock generator includes a reset pulse generator connected for receiving the edge detecting pulse output from the rising edge detector and the high-speed clock output from the asynchronous reset oscillator, and outputting a reset signal for resetting the coarse delay signal generator.

9. The variable delay circuit of claim 1 wherein the coarse delay signal generator comprises:
  N [$1/2^j$ ($1 \leq j \leq N$)] frequency dividers having input terminals connected for receiving the high-speed clock generated in the high-speed clock generator and output terminals from which respective frequency-divided high-speed clock signals having respective frequencies equal to the high-speed clock, divided by $2^j$, where j equals 1, 2 ... N, are output;
  N coincidence detectors connected for receiving respective frequency-divided high-speed clock signals and N delay time selecting data, for detecting coincidence between the signals and the data;
  an N-input NOR circuit having an output terminal and N input terminals connected for receiving outputs from the N coincidence detectors;
  a flip-flop having a data input to which the output terminal of the N-input NOR circuit is connected and a clock input connected for receiving the high-speed clock;
  means for delaying a data output signal from the flip-flop for a first time interval; and
  a resettable latch having a data input terminal connected for receiving an output signal from the means for delaying, a clock input terminal connected for receiving an inverted data signal from the flip-flop, and a reset input terminal connected for receiving the reset signal output from the reset pulse generator in response to a subsequent trigger signal and outputting an inverted signal as the coarse delay output.

10. The variable delay circuit of claim 1 wherein the reset pulse generator comprises:
  a two-input OR circuit having two input terminals connected for receiving the edge detecting pulse and the high-speed clock from the asynchronous reset oscillator;
  means for delaying the edge detecting pulse for a first time interval;

a latch circuit having a data input terminal connected for receiving an output from the means for delaying and an enable input terminal connected for receiving an output from the two-input OR circuit; and a flip-flop having a data input terminal connected for receiving an output from the latch circuit and a clock input terminal connected for receiving the high-speed clock from the asynchronous reset oscillator.

11. The variable delay circuit of claim 6 wherein the high-speed clock generator includes a reset pulse generator connected for receiving the edge detecting pulse output from the rising edge detector and the high-speed clock output from the asynchronous reset oscillator, and outputting a reset signal for resetting the coarse delay signal generator.

* * * * *